(12) United States Patent
Hong et al.

(10) Patent No.: US 6,424,046 B1
(45) Date of Patent: Jul. 23, 2002

(54) SUBSTRATE FOR MANUFACTURING A SEMICONDUCTOR DEVICE WITH THREE ELEMENT ALLOY

(75) Inventors: Soon Sung Hong, Cheonan; Ji Yong Lee; Byung Jun Park, both of Seoul, all of (KR)

(73) Assignee: Acqutek Semiconductor & Technology Co., Ltd., Seoul (KR)

( * ) Notice: Subject to any disclaimer, the term of this patent is extended or adjusted under 35 U.S.C. 154(b) by 0 days.

(21) Appl. No.: 09/934,793

(22) Filed: Aug. 22, 2001

(30) Foreign Application Priority Data

Aug. 23, 2000 (KR) .................................. 2000-0048799

(51) Int. Cl.<sup>7</sup> ............................................ H01L 23/48
(52) U.S. Cl. ................... 257/762; 257/766; 257/773; 257/677; 438/643; 438/687; 438/686; 438/650; 438/927
(58) Field of Search ................ 257/677, 751, 257/762, 766, 767, 772, 773; 438/627, 643, 653, 687, 650, 686, 927

(56) References Cited

U.S. PATENT DOCUMENTS 5,684,329 A  11/1997  Seiichi

FOREIGN PATENT DOCUMENTS

EP    0 250 146    12/1987

*Primary Examiner*—Nathan Flynn
*Assistant Examiner*—Pershelle Greene
(74) *Attorney, Agent, or Firm*—Brooks & Kushman P.C.

(57) ABSTRACT

The substrate according to the present invention is comprised of a silver/gold/grain element alloy layer, wherein the alloy forms an outside layer of the product. The grain element is selected from a group consisting of selenium, antimony, bismuth, nickel, cobalt, indium and combination thereof. The present invention has a particular application in forming the outside layer of various items, including a lead frame, a ball grid array, a header, a printed circuit board, a reed switch and a connector.

4 Claims, 1 Drawing Sheet

SUBSTRATE FOR MANUFACTURING A SEMICONDUCTOR DEVICE WITH THREE ELEMENT ALLOY

BACKGROUND OF THE INVENTION

1. Field of the Invention

The present invention relates to a substrate comprising a three element alloy, and particularly, relates to a substrate wherein the three element alloy comprising the Au/Ag/grain element is applied to a nickel layer which is applied to the copper or copper alloy, or nickel or nickel alloy, to provide the desired characteristics of improved bondability, corrosion durability, adhesion to mold resin and cost effectiveness.

2. Background Art

Generally, the substrates for a semiconductor device make electrical interconnections between electrical and electronic devices, which includes such devices as a semiconductor chip and a printed circuit board ("PCB"). Moreover, the characteristics of a good substrate material include bondability to connecting wires, durability from corrosion, adhesion to the mold resin (which typically acts as a cover), and ductility for manipulation.

To achieve such characteristics, conventional substrates for a semiconductor device have used an outermost layer of Sn—Pb in a multi-plated layer structure also including a copper layer and nickel layer, However, lead is widely considered to be a health hazard. Lead is toxic to human individuals and it has a long documented history of adverse impact on humans and the environment.

Conventionally, alternatives to the Sn—Pb layer have been a palladium layer or a gold layer as the outermost layer. However, a palladium layer or a gold layer has manifest problems in wire bondability, adhesion to the mold resin, and attachment characteristics for a PCB. Additionally, the costs of using palladium and of gold have traditionally been fairly high.

SUMMARY OF THE INVENTION

An object of the present invention is to provide substrates that are lead-free and thus environmentally friendly, while at the same time, providing the desired characteristics of improved bondability, corrosion durability, adhesion to mold resin, and cost effectiveness.

To achieve this object, the present invention uses the three element alloy comprising gold, silver and grain element selected from selenium, antimony, bismuth, nickel, cobalt and indium.

BRIEF DESCRIPTION OF THE DRAWINGS

The aforementioned aspects and other features of the invention will be explained in the following description, taken in conjunction with the accompanying drawing therein The accompanying drawing is a diagram of the substrate to which the three element alloy layer is applied, according to the present invention.

DETAILED DESCRIPTION OF THE PREFERRED EMBODIMENT(S)

Figure 1:
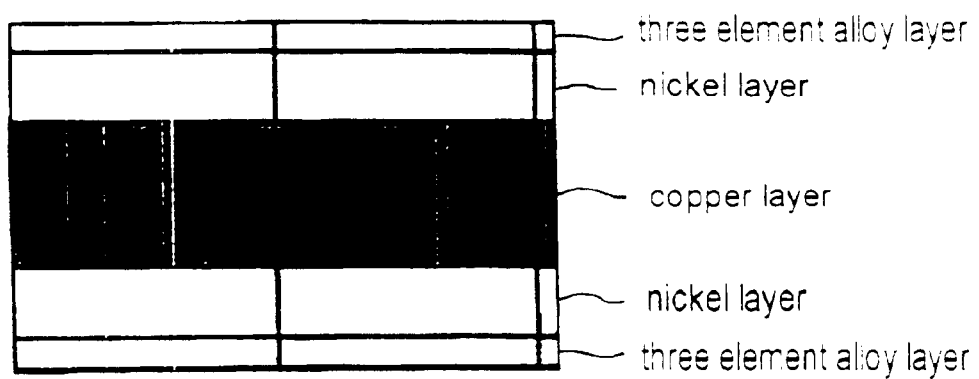

The substrate of the present invention comprises a patterned copper layer, a nickel layer having a thickness of 10–300 microinches, deposited on said patterned copper layer, and a three element alloy layer consisting of gold/silver/grain element and having a thickness of 3–160 microinches, deposited on said nickel layer.

The three element alloy layer comprises 50–95wt % of silver, 4–49wt % of gold and 1% or less of one of the grain elements. The grain element is selected from the group consisting of selenium, antimony, bismuth, nickel, cobalt and indium and more preferably, selenium. The addition of the grain element aids in refining grain morphology and decreasing the porosity of a deposited metal.

For the present invention, the nickel layer prevents the diffusion of the copper and improves the solder wettability upon mounting the package of the semiconductor chip onto the printed circuit board. The thickness of the nickel layer preferably ranges from 10 to 300 microinches. The upper, three elements alloy layer prevents the diffusion of the metals in the lower layers by heat, prevents the upper layer from oxidation and increases bondability with gold wire during wire bonding with the silicon chip. The thickness of the three element alloy layer preferably ranges from 3 to 160 microinches.

The substrate of the present invention has the characteristic that electric or electronic devices can be mounted without the plating of the Pb/Sn alloy. Further, as reported previously, silver has the problem that the adhesion to mold resin is decreased due to hygroscopicity but due to the present invention, such a problem is avoided.

The present invention can be used in manufacturing a lead frame, a ball grid array, a header, a printed circuit board, a Reed switch, a connector and various electronic components.

EXAMPLE

The present invention has been tested as detailed below. The test was conducted using gold/silver/selenium alloy, which is the most preferred alloy.

The Preparation of the Sample

The surface of the copper or copper alloy coil was degreased and activated by acid. The Ni and Au/Ag/selenium alloy was the electroplated orderly onto the entire surface of the copper or copper alloy base material.

Test for Evaluation of Bondability

After wire binding was conducted using a wire-bonding machine, the tensile strength was measured by using a bonding pull tester.

Test for Evaluation of Solder Wettability

After heat treatment at 175 for 7 hours and half, the sample was aged forcibly at 95 under 95% relative humidity for 8 hours. And, then evaluation of solder wettability was conducted, referring to MIL-STD-883D.

Test for Evaluation of Adhesion to Mold Resin

After the sample was sealed with a mold resin at molding temperature of 170 for 90 seconds and treated for 6 hours at 175 by heat, the adhesion between the substrate of the semiconductor device and mold resin was evaluated by using a SAT (Scanning Acoustic Tomograph) referring to the MRT (Moisture Resistance Test). The range of temperature was 55 to 125, and before to SAT was performed, the sample was cured at 125 for 24 hours.

Example 1 and Comparative Example 1

Evaluation Test on Bondability

The results of each of the evaluation tests are shown in Tables 1 and 2. In the Tables, the conditions prepared for each example are marked as symbol "•". Table 1 represents the results of the evaluation test for the layer plated according to the present invention and Table 2 represents the results of the evaluation test for the layer on which Au or Ag alone, or Au/Ag alloy is deposited, for comparison. In Table 2, samples 12–18 are for Ag alone, samples 19–24 are for Au alone and samples 25–30 are for Au/Ag alloy.

TABLE 1

| Laminate Structure Thickness (μin) | Ni 30 | Ni 50 | Ni 70 | Au/Ag/Se 5 | Au/Ag/Se 10 | Au/Ag/Se 15 | EDS Analysis (wt %) | Tensile Strength in Wire Bonding (g) |
|---|---|---|---|---|---|---|---|---|
| Sample 1  |   | ● |   | ● |   |   | Au 11, Ag 89 | 15.30 |
| Sample 2  |   | ● |   |   | ● |   | Au 16, Ag 84 | 15.60 |
| Sample 3  |   | ● |   |   |   | ● | Au 22, Ag 78 | 15.40 |
| Sample 4  | ● |   |   | ● |   |   | Au 27, Ag 73 | 15.40 |
| Sample 5  | ● |   |   |   | ● |   | Au 30, Ag 70 | 15.36 |
| Sample 6  | ● |   |   |   |   | ● | Au 35, Ag 65 | 16.21 |
| Sample 7  |   | ● |   |   | ● |   | Au 30, Ag 70 | 15.21 |
| Sample 8  |   | ● |   |   |   | ● | Au 33, Ag 67 | 16.21 |
| Sample 9  |   | ● |   |   | ● |   | Au 32, Ag 68 | 16.71 |
| Sample 10 |   |   | ● |   |   | ● | Au 34, Ag 66 | 16.15 |
| Sample 11 |   |   | ● | ● |   |   | Au 31, Ag 69 | 14.87 |
| Sample 12 |   |   | ● |   | ● |   | Au 31, Ag 69 | 15.88 |

TABLE 2

| Laminate Structure Thickness (μin) | Ni 30 | Ni 50 | Ni 70 | Ag, Au or Au/Ag 5 | Ag, Au or Au/Ag 10 | Ag, Au or Au/Ag 15 | EDS Analysis (wt %) | Tensile Strength in Wire Bonding (g) |
|---|---|---|---|---|---|---|---|---|
| Sample 13 |   | ● |   | ● |   |   | Ag 100 | — |
| Sample 14 |   | ● |   |   | ● |   | Ag 100 | — |
| Sample 15 |   | ● |   |   |   | ● | Ag 100 | — |
| Sample 16 | ● |   |   |   | ● |   | Ag 100 | — |
| Sample 17 |   | ● |   |   | ● |   | Ag 100 | — |
| Sample 18 |   |   | ● |   | ● |   | Ag 100 | — |
| Sample 19 |   | ● |   | ● |   |   | Au 100 | 11.25 |
| Sample 20 |   | ● |   |   | ● |   | Au 100 | 12.31 |
| Sample 21 |   | ● |   |   |   | ● | Au 100 | 12.33 |
| Sample 22 | ● |   |   |   | ● |   | Au 100 | 11.26 |
| Sample 23 |   | ● |   |   | ● |   | Au 100 | 10.55 |
| Sample 24 |   |   | ● |   | ● |   | Au 100 | 10.99 |
| Sample 25 |   | ● |   | ● |   |   | Au 11, Ag 89 | 9.66 |
| Sample 26 |   | ● |   |   | ● |   | Au 16, Ag 84 | 9.55 |
| Sample 27 |   | ● |   |   |   | ● | Au 22, Ag 78 | 10.25 |
| Sample 28 | ● |   |   |   | ● |   | Au 27, Ag 73 | 10.22 |
| Sample 29 |   | ● |   |   | ● |   | Au 30, Ag 70 | 11.23 |
| Sample 30 |   |   | ● |   | ● |   | Au 35, Ag 65 | 10.56 |

From the results of Tables 1 and 2, it is clear that the samples having a layer of Au/Ag/Se alloy show higher values in the tensile strength of wire bonding than samples having a layer of Au or Ag alone, or Au/Ag alloy. Also, as only Ag existed as an outermost layer, a gold wire could not be bonded on the surface of the Ag layer. Although a gold wire could be bonded on the surface of the Au/Ag alloy, the layer of Au/Ag/Se alloy according to the present invention showed much higher value in the tensile strength of the wire bonding than that of the Au/Ag alloy. In Table 1, the Se content was not detected by Energy Disperse Spectroscopy (EDS) analysis since only a small amount of Se was contained.

Example 2 and Comparative Example 2

Evaluation on Solder Wettability

The samples were evaluated on solder wettability. The condition of the samples was the same as Example 1 and Comparative Example 1. The results of the evaluation of the samples according to the present invention are presented in Table 3, and the results for the other samples are presented in Table 4. The Se content could not be detected by EDS analysis as in Table 1.

TABLE 3

| Laminate Structure Thickness (μin) | Ni 30 | Ni 50 | Ni 70 | Au/Ag/Se 5 | Au/Ag/Se 10 | Au/Ag/Se 15 | EDS Analysis (wt %) | Covered Amount (%) |
|---|---|---|---|---|---|---|---|---|
| Sample 1  |   | ● |   | ● |   |   | Au 11, Ag 89 | 99–100 |
| Sample 2  |   | ● |   |   | ● |   | Au 16, Ag 84 | 99–100 |
| Sample 3  |   | ● |   |   |   | ● | Au 22, Ag 78 | 99–100 |
| Sample 4  | ● |   |   | ● |   |   | Au 27, Ag 73 | 99–100 |
| Sample 5  | ● |   |   |   | ● |   | Au 30, Ag 70 | 99–100 |
| Sample 6  | ● |   |   |   |   | ● | Au 35, Ag 65 | 99–100 |
| Sample 7  |   | ● |   |   | ● |   | Au 30, Ag 70 | 99–100 |
| Sample 8  |   | ● |   |   |   | ● | Au 33, Ag 67 | 99–100 |
| Sample 9  |   | ● |   |   | ● |   | Au 32, Ag 68 | 99–100 |
| Sample 10 |   |   | ● |   |   | ● | Au 34, Ag 66 | 99–100 |
| Sample 11 |   |   | ● | ● |   |   | Au 31, Ag 69 | 99–100 |
| Sample 12 |   |   | ● |   | ● |   | Au 31, Ag 69 | 99–100 |

TABLE 4

| Laminate Structure Thickness (μin) | Ni 30 | Ni 50 | Ni 70 | Ag, Au or Au/Ag 5 | Ag, Au or Au/Ag 10 | Ag, Au or Au/Ag 15 | EDS Analysis (wt %) | Covered Amount (%) |
|---|---|---|---|---|---|---|---|---|
| Sample 13 |   | ● |   | ● |   |   | Cu3, Ni5, Ag92 | 58 |
| Sample 14 |   | ● |   |   | ● |   | Cu2, Ni4, Ag94 | 65 |
| Sample 15 |   | ● |   |   |   | ● | Cu1, Ni4, Ag95 | 70 |
| Sample 16 | ● |   |   |   | ● |   | Cu4, Ni3, Ag93 | 55 |
| Sample 17 |   | ● |   |   | ● |   | Cu2, Ni4, Ag94 | 65 |
| Sample 18 |   |   | ● |   | ● |   | Cu1, Ni4, Ag95 | 75 |
| Sample 19 |   | ● |   | ● |   |   | Cu2, Ni5, Ag93 | 72 |
| Sample 20 |   | ● |   |   | ● |   | Cu1, Ni4, Ag95 | 80 |
| Sample 21 |   | ● |   |   |   | ● | Cu1, Ni3, Ag96 | 89 |
| Sample 22 | ● |   |   |   | ● |   | Cu4, Ni3, Ag93 | 77 |
| Sample 23 |   | ● |   |   | ● |   | Cu1, Ni1, Ag98 | 80 |
| Sample 24 |   |   | ● |   | ● |   | Cu1, Ni1, Ag98 | 90 |
| Sample 25 |   | ● |   | ● |   |   | Ni5, Au11, Ag84 | 94 |
| Sample 26 |   | ● |   |   | ● |   | Ni4, Au16, Ag80 | 95 |
| Sample 27 |   | ● |   |   |   | ● | Ni2, Au22, Ag76 | 95 |
| Sample 28 | ● |   |   |   | ● |   | Ni3, Au27, Ag70 | 94 |
| Sample 29 |   | ● |   |   | ● |   | Ni4, Au30, Ag66 | 96 |
| Sample 30 |   |   | ● |   | ● |   | Ni4, Au35, Ag61 | 94 |

According to the results of Table 4, Ni and Cu were detected by EDS analysis on the surface of Au or Ag alone, or Au/Ag alloy in samples 13 to 24. Also, the covered amount (%) of solder in an evaluation on solder wettability did not reach above the 95%, pass limit. As a result, the diffusion of Ni or Cu made the substrates deteriorate in solder wettability. On the other hand, according to the results of Table 3, the samples having an outermost layer of Au/Ag/Se alloy which were not contaminated by the diffusion of Ni or Cu all passed in an evaluation on solder wettability, showing a reading of over 99%.

Example 3 and Comparative Example 3

Evaluation on Adhesion of Mold Resin

The samples were evaluated on adhesion of the mold resin. The condition of the samples was the same as in Example 1 and comparative Example 1. The results of the evaluation for the samples according to the present invention are presented in Table 5, and the results for other samples are presented in Table 6. In comparative example 3, the layer of Au/Ag alloy was not used.

TABLE 5

| Laminate Structure Thickness (μin) | Ni | | | Au/Ag/Se | | | EDS Analysis (wt %) | Adhesion of Mold Resin |
|---|---|---|---|---|---|---|---|---|
| | 30 | 50 | 70 | 5 | 10 | 15 | | |
| Sample 1 | | ● | | ● | | | Au 11, Ag 89 | Pass |
| Sample 2 | | ● | | | ● | | Au 16, Ag 84 | Pass |
| Sample 3 | | ● | | | | ● | Au 22, Ag 78 | Pass |
| Sample 4 | ● | | | ● | | | Au 27, Ag 73 | Pass |
| Sample 5 | ● | | | | ● | | Au 30, Ag 70 | Pass |
| Sample 6 | ● | | | | | ● | Au 35, Ag 65 | Pass |
| Sample 7 | | ● | | | ● | | Au 30, Ag 70 | Pass |
| Sample 8 | | ● | | | | ● | Au 33, Ag 67 | Pass |
| Sample 9 | | ● | | | ● | | Au 32, Ag 68 | Pass |
| Sample 10 | | | ● | | | ● | Au 34, Ag 66 | Pass |
| Sample 11 | | | ● | ● | | | Au 31, Ag 69 | Pass |
| Sample 12 | | | ● | | ● | | Au 31, Ag 69 | Pass |

TABLE 6

| Laminate Structure Thickness (μin) | Ni | | | Ag or Au | | | EDS Analysis (wt %) | Adhesion of Mold Resin (%) |
|---|---|---|---|---|---|---|---|---|
| | 30 | 50 | 70 | 5 | 10 | 15 | | |
| Sample 13 | | ● | | ● | | | Ag 100 | Failure |
| Sample 14 | | ● | | | ● | | Ag 100 | Failure |
| Sample 15 | | ● | | | | ● | Ag 100 | Failure |
| Sample 16 | ● | | | | ● | | Ag 100 | Failure |
| Sample 17 | | ● | | | ● | | Ag 100 | Failure |
| Sample 18 | | | ● | | ● | | Ag 100 | Failure |
| Sample 19 | | ● | | ● | | | Au 100 | Pass |
| Sample 20 | | ● | | | ● | | Au 100 | Pass |
| Sample 21 | | ● | | | | ● | Au 100 | Pass |
| Sample 22 | ● | | | | ● | | Au 100 | Pass |
| Sample 23 | | ● | | | ● | | Au 100 | Pass |
| Sample 24 | | | ● | | ● | | Au 100 | Pass |

According to the results of Tables 5 and 6, the sample of Au or Au/Ag/Se alloy deposited as an outermost layer on the Ni plated layer attain better adhesion of mold resin than the sample of only Ag deposited as an outermost layer on the Nickel plated layer. If the SAT system detected voids or gaps between the substrates and mold resin, the sample was considered as a failure.

It is understood that while the various particular embodiments set forth herein have been described in detail, the description has been given for illustrative purposes only, and it is to be understood that changes and variables may be made without departing from the spirit or scope of the following claims.

What is claimed is:

1. A substrate for semiconductor device comprising:

a patterned copper layer;

a nickel layer having a thickness of 10–300 microinches, deposited on said patterned copper layer; and a three element alloy layer consisting of gold/silver/grain element and having a thickness of 3–160 microinches, deposited on said nickel layer.

2. A substrate according to claim 1, wherein the said grain element is selected from a group consisting of Se, At, Bi, Ni, Co and In.

3. A substrate according to claim 1, wherein said three element alloy contains 50–95 wt % of Ag, 4–49 wt % of Au and less than 1 wt % of grain element.

4. A substrate according to claim 1 for use in manufacturing electronic components, a printed circuit board, a ball grid array and a lead frame.

* * * * *